United States Patent
Chung et al.

(10) Patent No.: US 7,817,846 B2
(45) Date of Patent: Oct. 19, 2010

(54) METHOD OF CORRECTING BONDING COORDINATES USING REFERENCE BOND PADS

(75) Inventors: Yong-bok Chung, Seongnam-si (KR); Jeong-ho Cho, Seongnam-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 1133 days.

(21) Appl. No.: 11/485,488

(22) Filed: Jul. 12, 2006

(65) Prior Publication Data

US 2007/0230771 A1  Oct. 4, 2007

(30) Foreign Application Priority Data

Mar. 28, 2006  (KR)  ...................... 10-2006-0027974

(51) Int. Cl.
   *G06K 9/00*  (2006.01)
(52) U.S. Cl. ........................ 382/151; 700/121; 228/904
(58) Field of Classification Search ................ 382/141, 382/145, 151, 152; 174/538; 250/559.34; 257/784; 438/617; 228/180.5
   See application file for complete search history.

(56) References Cited

U.S. PATENT DOCUMENTS

| | | | | |
|---|---|---|---|---|
| 4,091,394 A | * | 5/1978 | Kashioka et al. | 382/151 |
| 4,163,212 A | * | 7/1979 | Buerger et al. | 382/151 |
| 4,213,117 A | * | 7/1980 | Kembo et al. | 382/145 |
| 4,334,241 A | * | 6/1982 | Kashioka et al. | 348/87 |
| 4,390,955 A | * | 6/1983 | Arimura | 716/21 |
| 4,450,579 A | * | 5/1984 | Nakashima et al. | 382/151 |
| 4,651,341 A | * | 3/1987 | Nakashima et al. | 382/222 |
| 5,119,436 A | * | 6/1992 | Holdgrafer | 382/146 |
| 5,292,050 A | * | 3/1994 | Nagaoka et al. | 228/4.5 |
| 5,621,813 A | * | 4/1997 | Brown et al. | 382/151 |
| 5,754,677 A | * | 5/1998 | Kawada | 382/141 |
| 5,754,679 A | * | 5/1998 | Koljonen et al. | 382/151 |
| 5,903,662 A | * | 5/1999 | DeCarlo | 382/151 |
| 6,250,534 B1 | * | 6/2001 | Sasano | 228/102 |
| 6,289,492 B1 | * | 9/2001 | Dutta-Choudhury et al. | 716/5 |
| 6,574,524 B2 | | 6/2003 | Kim | |
| 6,629,013 B2 | * | 9/2003 | Koduri et al. | 700/121 |
| 6,820,792 B2 | | 11/2004 | Kim et al. | |

(Continued)

FOREIGN PATENT DOCUMENTS

KR  1999-0057772 A  7/1999

OTHER PUBLICATIONS

Flack et al. (May 1995) "Application of pattern recognition in mix-and-match lithography." SPIE vol. 2440 pp. 913-927.*

*Primary Examiner*—Brian P Werner
*Assistant Examiner*—Barry Drennan
(74) *Attorney, Agent, or Firm*—Drinker Biddle & Reath LLP

(57) ABSTRACT

A method of correcting bonding coordinates according to locations of a die and leads loaded for bonding is provided. The method includes searching for locations of die recognition areas and lead recognition areas, comparing the detected locations of the recognition areas, and correcting bonding coordinates of the die and the leads according to the result obtained by the comparison; and if a search for the locations of the die recognition areas fails, searching for reference bond pads, comparing locations of the detected reference bond pads with setting locations, and correcting bonding coordinates of a die and leads to be bonded according to the result obtained by the comparison.

14 Claims, 7 Drawing Sheets

U.S. PATENT DOCUMENTS

| | | | |
|---|---|---|---|
| 6,868,176 B2 * | 3/2005 | Sugawara | 382/151 |
| 7,069,102 B2 * | 6/2006 | Bon et al. | 700/121 |
| 2002/0014515 A1 * | 2/2002 | Koduri | 228/105 |

* cited by examiner

METHOD OF CORRECTING BONDING COORDINATES USING REFERENCE BOND PADS

CROSS-REFERENCE TO RELATED PATENT APPLICATIONS

This application claims the benefit of Korean Patent Application No. 10-2006-0027974, filed on Mar. 28, 2006, in the Korean Intellectual Property Office, the disclosure of which is incorporated herein in its entirety by reference.

BACKGROUND OF THE INVENTION

1. Field of the Invention

The present invention relates to a method of correcting bonding coordinates, and more particularly, to a method of correcting bonding coordinates according to the locations of a die and leads that are loaded in a wire bonder apparatus for bonding.

2. Description of the Related Art

FIG. 1 illustrates a die 201 and leads 203 (e.g., of a lead frame) that are loaded in a wire bonder apparatus for bonding. Referring to FIG. 1, reference numeral 202 indicates a bond pad of a plurality of bond pads labeled P1 through PN, label P-1 indicates a first die recognition area, label P-2 indicates a second die recognition area, label L-1 indicates a first lead recognition area, and label L-2 indicates a second lead recognition area.

FIG. 2 is a flowchart of a conventional teaching algorithm that is used for a conventional method of correcting bonding coordinates. Referring to FIGS. 1 and 2, before continuous bonding is performed, an operator performs a teaching operation (i.e., manually identifying visual points and data entry) to assign coordinates to bonding points of the bond pads P1 through PN of the reference die 201, bonding points of the leads 203, and recognition areas P-1, P-2, L-1, and L-2. The recognition areas can be generally called eye points.

When the operator completes the teaching operation (Operation S201), a controller (not shown) of a wire bonder apparatus stores the bonding coordinates of the bond pads and leads (Operation S202). Also, the controller of the wire bonder apparatus stores center coordinates and reference image data of the recognition areas (Operation S203).

FIG. 3 is a flowchart of a conventional method of correcting bonding coordinates when materials and elements are loaded in a wire bonder apparatus for bonding. Referring to FIGS. 1 through 3, the controller of the wire bonder apparatus searches for locations of the die recognition areas P-1 and P-2 and the lead recognition areas L-1 and L-2 with respect to the die 201 and the leads 203 (Operation S301). In detail, a vision system (not shown) compares image data with the reference image data (i.e., image data of a previous or example die and leads) to search for the locations of the die recognition areas P-1 and P-2 and the lead recognition areas L-1 and L-2 of the instant die that is loaded for bonding.

If the locations of the die recognition areas P-1 and P-2 and the lead recognition areas L-1 and L-2 are successfully searched for, the controller of the wire bonder apparatus compares the locations of the recognition areas P-1, P-2, L-1, and L-2 of the instant die and leads with set locations, and corrects the bonding coordinates of the instant die 201 and the leads 203 according to the comparison result (Operations S302, S304, and S305).

If the search for the locations of the instant die recognition areas P-1 and P-2 or the location of the instant lead recognition areas L-1 and L-2 fails, the controller of the wire bonder apparatus indicates an arrangement error and discontinues the wire bonding (Operations S302 and S303).

In this conventional method of correcting bonding coordinates, the search for the locations of the instant die recognition areas P-1 and P-2 in Operation S302 frequently fails, because dies in a lot may vary unpredictably and non-uniformly. For example, the die recognition areas P-1 and P-2 are frequently obscured by epoxy or tape that is applied during a die attach process before the wire bonding. Further, when a die is partially coated, the die recognition areas P-1 and P-2 may be coated.

Therefore, according to the conventional method of correcting bonding coordinates, since the search for the locations of the die recognition areas P-1 and P-2 fails frequently, the wire bonding is frequently discontinued. A method of correcting bonding coordinates that failed less frequently would, therefore, be an important improvement in the art.

SUMMARY OF THE INVENTION

According to an aspect of the present invention, there is provided a method of correcting bonding coordinates according to locations of an instant die and leads that are loaded in a wire bonder apparatus for bonding, the method comprising steps of: searching for locations of die recognition areas and lead recognition areas on an instant die and leads, comparing the detected locations of the recognition areas with setting locations, and correcting bonding coordinates of the die and the leads according to a comparison result; and if a search for the locations of the die recognition areas fails, searching for reference bond pads, comparing locations of the detected reference bond pads with set locations, and correcting bonding coordinates of an instant die and leads to be bonded according to a comparison result.

Therefore, if the searching for the die recognition areas fails, the bonding coordinates of the die are corrected according to the result obtained by searching for the reference bond pads, thereby preventing the wire bonding from being frequently discontinued.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EMBODIMENTS

The present invention will now be described more fully with reference to the accompanying drawings.

Figure 1:
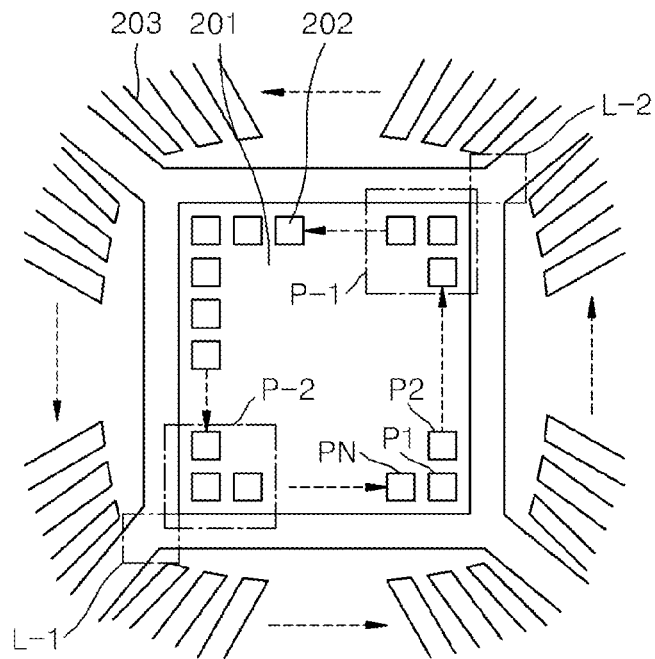
FIG. 1 illustrates a die and leads loaded for bonding.
Figure 2:
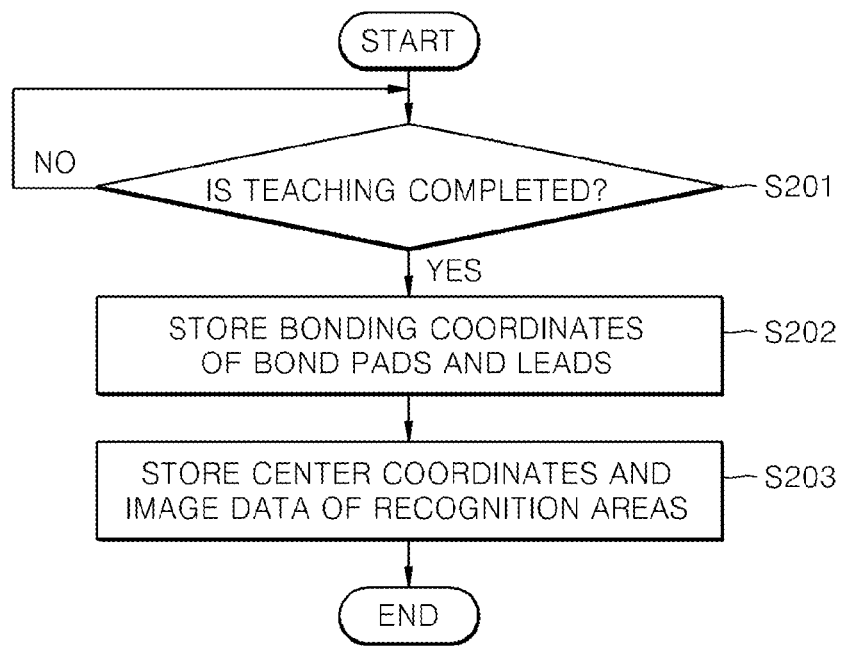
FIG. 2 is a flowchart of a teaching algorithm for a conventional method of correcting bonding coordinates.
Figure 3:
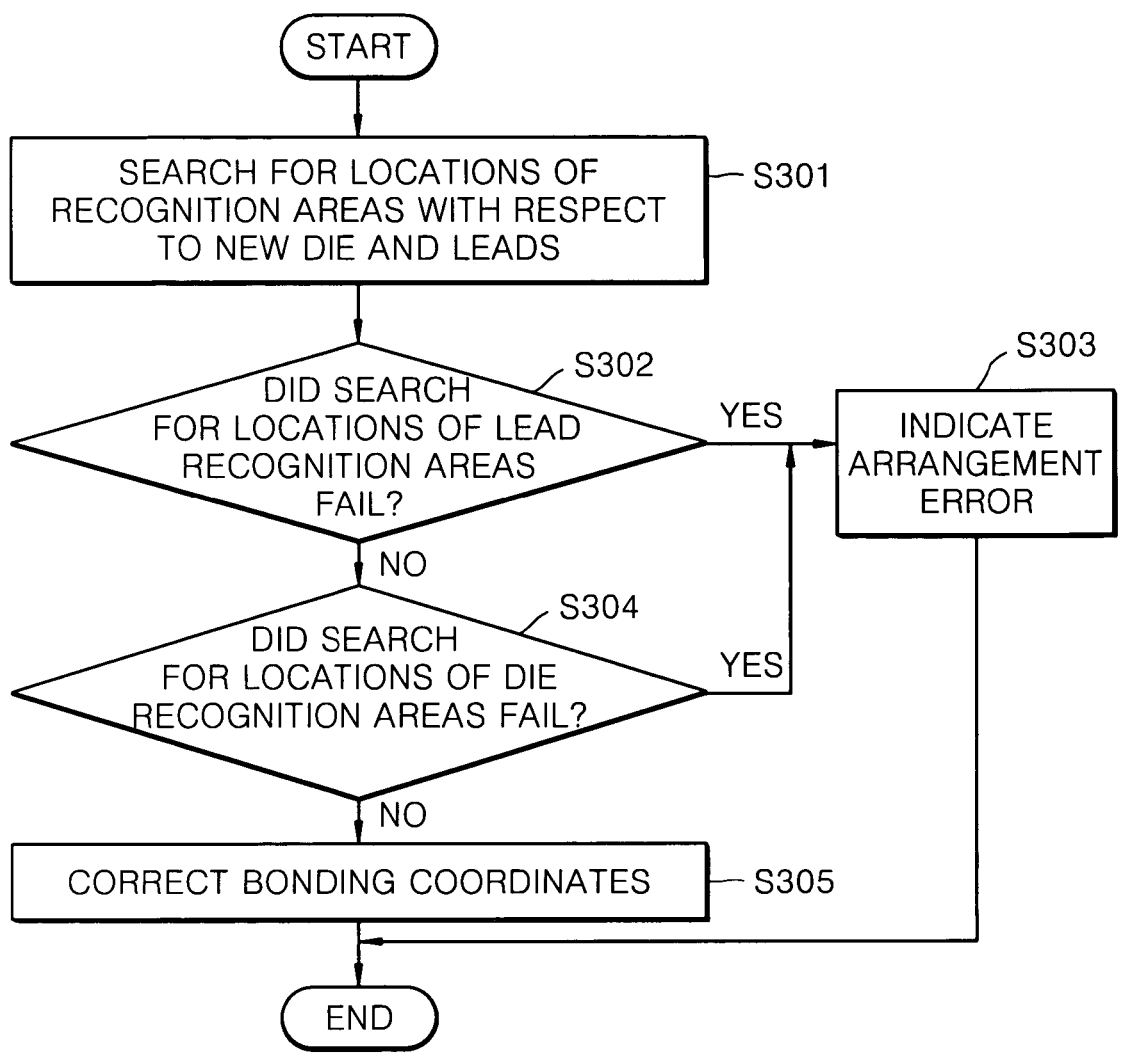
FIG. 3 is a flowchart of a conventional method of correcting bonding coordinates when materials and elements for bonding are loaded.
Figure 4:
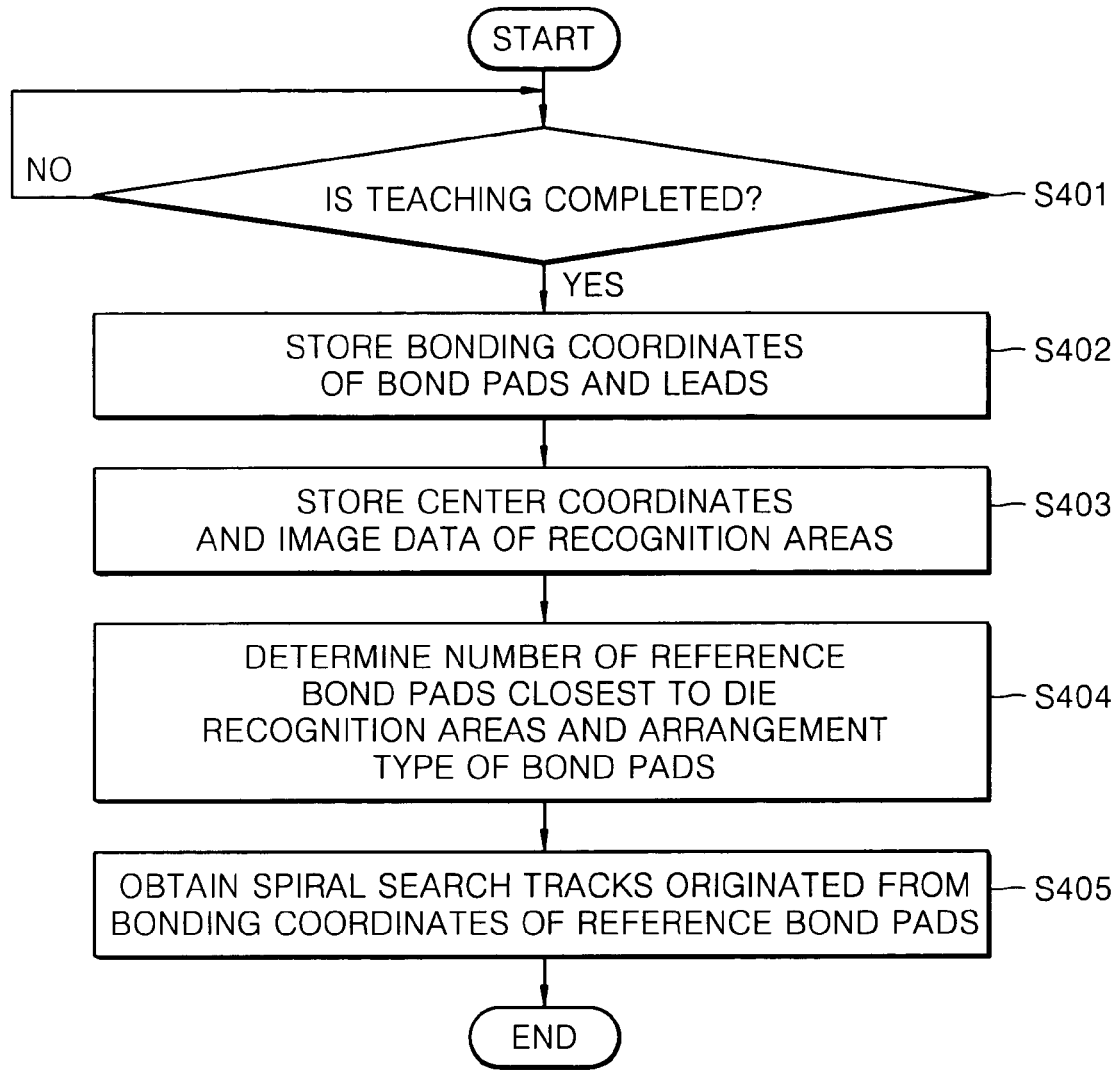
FIG. 4 is a flowchart of a teaching algorithm for a method of correcting bonding coordinates according to an embodiment of the present invention.

FIG. 4 is a flowchart of a teaching algorithm for a method of correcting bonding coordinates according to an embodiment of the present invention. Referring to FIGS. 1 and 4, before continuous bonding is performed, an operator performs a teaching operation to assign coordinates to bonding points of the bond pads P1 through PN of an example or reference die 201, bonding points of the leads 203, and recognition areas P-1, P-2, L-1, and L-2.

When the operator completes the teaching operation (Operation S401), a controller (not shown) of a wire bonder apparatus (not shown) stores the bonding coordinates of the plurality of bond pads 202 (labeled P1 through PN) and leads 203 (Operation S402). Also, the controller of the wire bonder apparatus stores center coordinates and image data of the recognition areas P-1, P-2, L-1 and L-2 (Operation S403).

The controller of the wire bonder determines the number of reference bond pads closest to the die recognition areas P-1 and P-2, and also determines an arrangement type of the plurality of bond pads 202 (P1 through PN) (Operation S404). In the current example with respect to die 201 (FIG. 1), since the number of the die recognition areas P-1 and P-2 is 2, the number of the reference bond pads is also 2.

The controller of the wire bonder apparatus obtains spiral search tracks originated from each of bonding coordinates of the reference bond pads (Operation S405).

Figure 5:
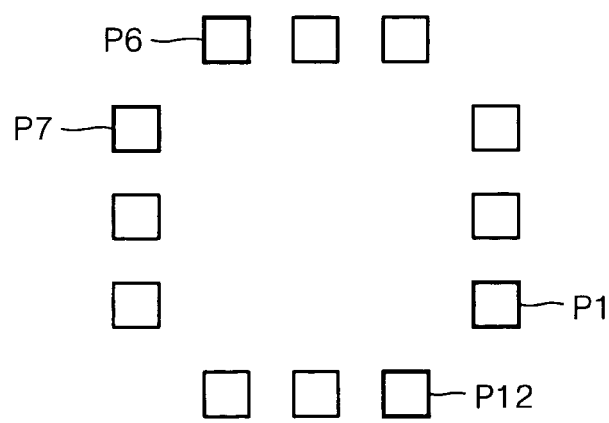
FIG. 5 illustrates bond pads arranged in the shape of a box.

FIG. 5 illustrates bond pads P1 through P12 arranged in the shape of a box. Referring to FIG. 5, Operation S404 (FIG. 4) will now be described for the case where the bond pads P1 through P12 are arranged in the shape of the box.

When a first die recognition area P-1 is close to the bond pads P6 and P7, one of the bond pads P6 and P7 is determined as a first reference bond pad. Likewise, when a second die recognition area P-2 is close to the bond pads P1 and P12, one of the bond pads P1 and P12 is determined as a second reference bond pad.

Further, it is determined that bond pads to be bonded in the future are arranged in the shape of a box as shown in FIG. 5.

Figure 6:
FIG. 6 illustrates bond pads arranged in a single row.

FIG. 6 illustrates bond pads P1 through P6 arranged in a single row. Referring to FIG. 6, Operation S404 (FIG. 4) will now be described for the case where the bond pads P1 through P6 are arranged in a single row.

When the first die recognition area P-1 is closest to the bond pad P1, the bond pad P1 is determined as the first reference bond pad. Likewise, when the second die recognition area P-2 is closest to the bond pad P6, the bond pad P6 is determined as the second reference bond pad. It is determined that the second reference bond pad may be farthest from the first reference bond pad.

Further, it is determined that bond pads to be bonded are arranged in the single row as shown in FIG. 6.

Figure 7:
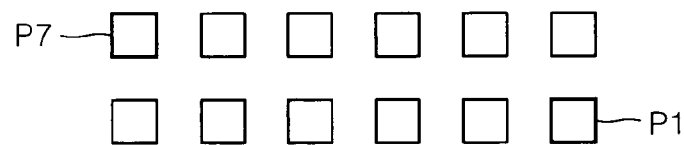
FIG. 7 illustrates bond pads arranged in two rows.

FIG. 7 illustrates bond pads P1 through P7 arranged in two rows. Referring to FIG. 7, Operation S404 (FIG. 4) will now be described for the case where the bond pads P1 through P7 are arranged in the two rows.

When the first die recognition area P-1 is closest to the bond pad P1, the bond pad P1 is determined as the first reference bond pad. Likewise, when the second die recognition area P-2 is closest to the bond pad P7, the bond pad P7 is determined as the second reference bond pad. It is determined that the second reference bond pad may be farthest from the first reference bond pad.

Further, it is determined that bond pads to be bonded are arranged in two rows as shown in FIG. 7.

Figure 8:
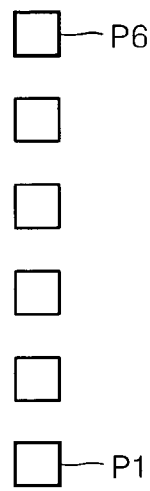
FIG. 8 illustrates bond pads arranged in a single column.

FIG. 8 illustrates bond pads P1 through P6 arranged in a single column. Referring to FIG. 8, Operation S404 (FIG. 4) will now be described for the case where the bond pads P1 through P6 are arranged in a single column.

When the first die recognition area P-1 is closest to the bond pad P1, the bond pad P1 is determined as the first reference bond pad. Likewise, when the second die recognition area P-2 is closest to the bond pad P6, the bond pad P6 is determined as the second reference bond pad. It is determined that the second reference bond pad may be farthest from the first reference bond pad.

Further, it is determined that bond pads to be bonded are arranged in the single column as shown in FIG. 8.

Figure 9:
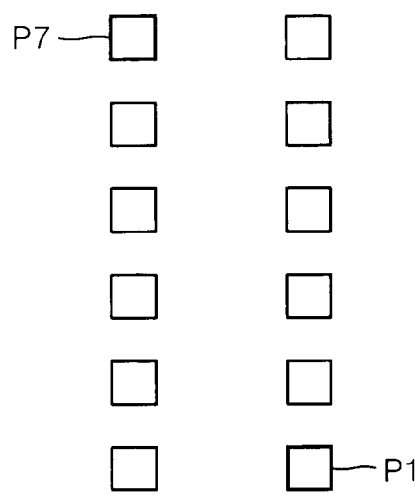
FIG. 9 illustrates bond pads arranged in two columns.

FIG. 9 illustrates bond pads P1 through P7 arranged in two columns. Referring to FIG. 9, Operation S404 (FIG. 4) will now be described for the case where the bond pads P1 through P7 are arranged in the two columns.

When the first die recognition area P-1 is closest to the bond pad P1, the bond pad P1 is determined as the first reference bond pad. Likewise, when the second die recognition area P-2 is closest to the bond pad P7, the bond pad P7 is determined as the second reference bond pad. It is determined that the second reference bond pad may be farthest from the first reference bond pad.

Further, it is determined that bond pads to be bonded are arranged in two columns as shown in FIG. 9.

Figure 10:
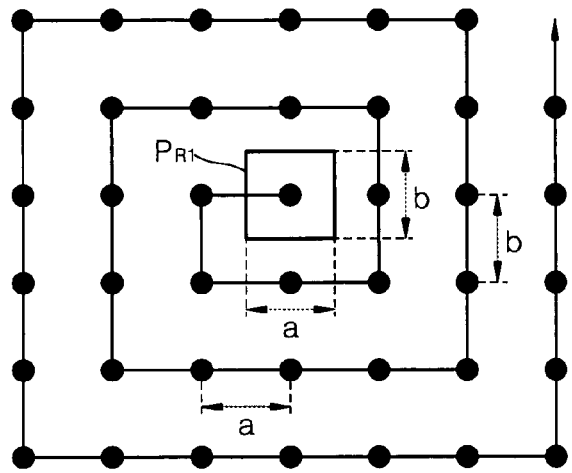
FIG. 10 illustrates spiral search tracks obtained by performing Operation S405 illustrated in FIG. 4.

FIG. 10 illustrates spiral search tracks obtained by performing Operation S405 illustrated in FIG. 4. Referring to FIG. 10, the spiral search tracks are obtained counterclockwise from bonding coordinates $P_{R1}$ of the first or second reference bond pad. A movement distance, which is indicated by "a", along an X axis between search points is identical to the width "a" along the X axis of the first or second reference bond pad. Also, a movement distance, which is indicated by "b", on a Y axis between search points is identical to the width "b" along the Y axis of the first or second reference bond pad.

Figure 11:
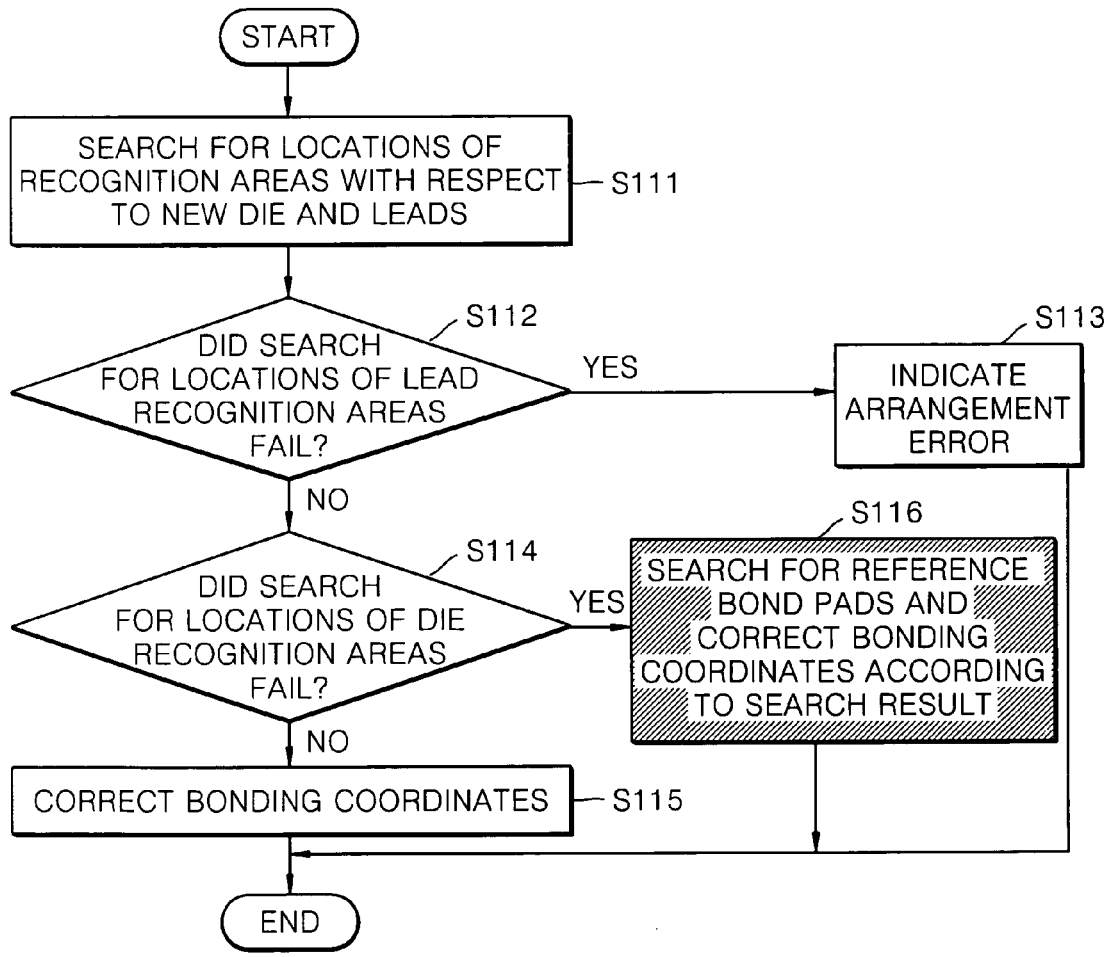
FIG. 11 is a flowchart of a method of correcting bonding coordinates when a die and leads as illustrated in FIG. 1 are loaded for bonding according to an embodiment of the present invention.

FIG. 11 is a flowchart illustrating a method of correcting bonding coordinates when the die 201 and the leads 203 as illustrated in FIG. 1 are loaded in a wire bonder apparatus for bonding according to an embodiment of the present invention. Referring to FIGS. 1 and 4 through 11, when the die 201 and the leads 203 are loaded for the bonding, the controller of the wire bonder apparatus first searches for the locations of the die recognition areas P-1 and P-2 and the lead recognition areas L-1 and L-2 with respect to the die 201 and the leads 203 (Operation S111). In an example, a vision system of the wire bonder apparatus compares image data of the instant die and leads with the reference image data to search for the locations of the die recognition areas P-1 and P-2 and the lead recognition areas L-1 and L-2.

If the searching for the locations of the lead recognition areas L-1 and L-2 fails in Operation S112, the controller of the wire bonder apparatus indicates an arrangement error and discontinues the wire bonding in Operation 113.

If the searching for the locations of the lead recognition areas L-1 and L-2 is successful in Operation S112, the controller of the wire bonder apparatus in Operation S114 determines whether a search for the die recognition areas P-1 and P-2 has been successful.

In step S114, if it is determined that the controller of the wire bonder apparatus has succeeded in searching for the die recognition areas P-1 and P-2, the controller of the wire bonder apparatus compares the locations of the recognition areas with setting locations and in Operation S115 corrects the bonding coordinates of the die 201 and the leads 203 according to the result obtained by the comparison.

If it is determined in Operation S114 that the searching for the die recognition areas P-1 and P-2 fails, the controller of the wire bonder apparatus in Operation S116 then searches for the reference bond pads determined in Operation S404 (FIG. 4), compares locations of the reference bond pads with the setting locations, and corrects the bonding coordinates of the die 201 and the lead 203 according to the result obtained by the comparison.

Therefore, if the searching for the die recognition areas P-1 and P-2 fails, the controller of the wire bonder apparatus corrects the bonding coordinates of the die 201 according to the result obtained by searching for the reference bond pads, thereby preventing the wire bonding from being frequently discontinued.

Figure 12:
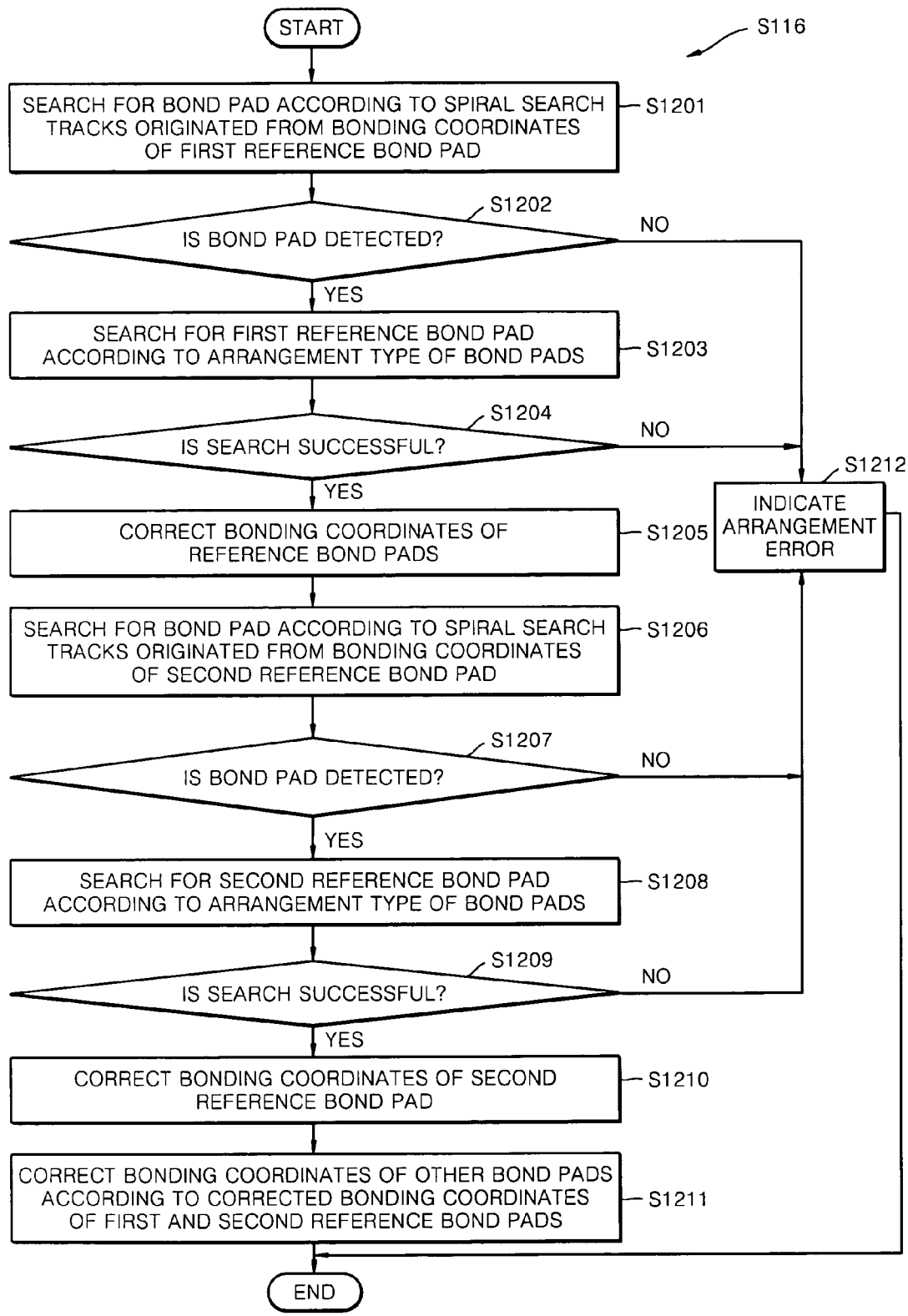
FIG. 12 is a flowchart of a detailed algorithm of Operation S116 illustrated in FIG. 11.

FIG. 12 is a flowchart illustrating a detailed algorithm of Operation S116 illustrated in FIG. 11. Referring to FIG. 12, the controller of the wire bonder apparatus searches for the first reference bond pad according to the spiral search tracks originated from the bonding coordinates of a first reference bond pad (Operations S1201 through S1203).

If the searching for the first reference bond pad fails in Operations S1202 or S1204, the controller of the wire bonder apparatus indicates an erroneous arrangement in Operation S1212 and discontinues the wire bonding.

If the searching for the first reference bond pad is successful, the controller of the wire bonder apparatus corrects the bonding coordinates of a second reference bond pad and the first reference bond pad according to center coordinates of the first reference bond pad (Operation S1205).

In Operation S1206 the controller of the wire bonder apparatus searches for the second reference bond pad according to the spiral search tracks originated from the corrected bonding coordinates of the second reference bond pad.

If the searching according to the spiral search tracks for the second reference bond pad fails in Operation S1207, the controller of the wire bonder apparatus in Operation S1212 indicates the erroneous arrangement and discontinues the wire bonding.

In Operation S1207 if the searching for the second reference bond pad is successful, the controller of the wire bonder apparatus next in Operation S1208 searches for the second reference bod pad according to an arrangement type of the bond pads.

In Operation S1209 if the searching for the second reference bond pad according to the arrangement type of the bond pads is not successful, the controller of the wire bonder apparatus in Operation S1212 indicates the erroneous arrangement and discontinues the wire bonding.

In Operation S1209 if the searching for the second reference bond pad according to the arrangement type of the bond pads is successful, the controller of the wire bonder apparatus continues to Operation S1210.

The controller of the wire bonder corrects the bonding coordinates of the second reference bond pad to the center coordinates of the second reference bond pad (Operation S1210).

Next, the controller of the wire bonder apparatus corrects the bonding coordinates of the other bond pads according to the corrected coordinates of the first and second reference bond pads (Operation S1211).

Operations S1201 through S1203 of searching for the first reference bond pad will now be described in further detail.

The controller of the wire bonder apparatus searches for a bond pad according to the spiral search tracks (FIG. 10) originated from the bonding coordinates of the first reference bond pad (Operation S1201).

If the spiral searching for the bond pad fails, the controller of the wire bonder apparatus indicates the arrangement error and discontinues the wire bonding (Operations S1202 and S1212).

If the searching for the bond pad is successful, the controller of the wire bonder apparatus searches for the first reference bond pad according to the arrangement type (see various arrangement types illustrated in FIGS. 5 through 9) of the bond pads starting from center coordinates of the detected bond pad (Operation S1203). Operation S1203 will now be in detail described with reference to FIGS. 13 through 15.

Likewise, Operations S1206 through S1208 of searching for the second reference bond pad will now be in detail described.

The controller of the wire bonder apparatus searches for a bond pad according to the spiral search tracks (FIG. 10) originated from the bonding coordinates of the second reference bond pad (Operation S1206).

If the searching for the bond pad fails, the controller of the wire bonder indicates the erroneous arrangement and discontinues the wire bonding (Operations S1207 and S1212).

If the searching for the bond pad is successful, the controller of the wire bonder apparatus searches for the second reference bond pad according to the arrangement type (refer to FIGS. 5 through 9) of the bond pads, starting from center coordinates of the detected bond pad (Operation S1208). Operation S1208 will now be in detail described with reference to FIGS. 13 through 15.

Figure 13:
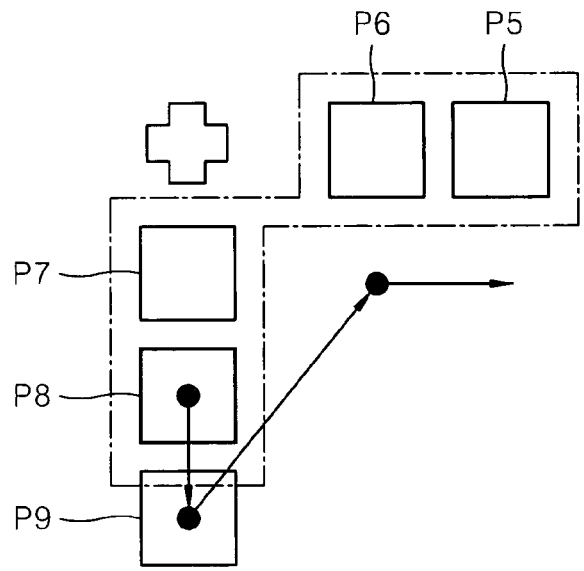
FIG. 13 is a diagram for explaining Operation S1203 or S1208 illustrated in FIG. 12 when bond pads are arranged in the shape of a box.

FIG. 13 is a diagram for explaining Operation S1203 or S1208 (FIG. 12) when the bond pads are arranged in the shape of a box. Referring to FIG. 13, since the bond pad P7 is a reference bond pad, a search sequence is performed in a direction of an arrow according to the arrangement type of the bond pads.

When the bond pad detected in Operation S1201 or S1206 is the bond pad P8, assuming that the bond pad P8 is the reference bond pad, it is determined whether the bond pad P8 has the same arrangement type as that of bond pads P5 through P9.

In detail, when the search sequence is performed in the direction of the arrow starting from a center point of the bond pad P8, since the bond pad P8 does not have the same arrangement type as that of the bond pads P5 through P9, it is identified that the bond pad P8 is not the reference bond pad.

If the bond pad P8 is not the reference bond pad, the search sequence is performed for each of the bond pads adjacent to the bond pad P8 in the direction of the arrow until the reference bond pad is determined. Thus, the controller of the wire bonder apparatus recognizes the bond pad P7 as the reference bond pad.

Figure 14:
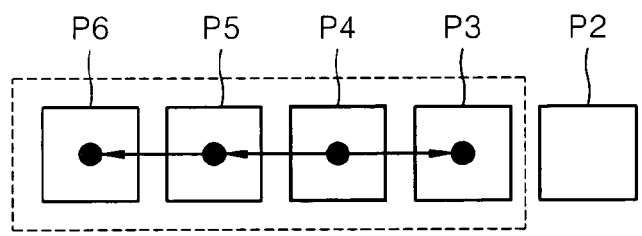
FIG. 14 is a diagram for explaining Operation S1203 or S1208 illustrated in FIG. 12 when bond pads are arranged in a single row.

FIG. 14 is a diagram for explaining Operation S1203 or S1208 (FIG. 12) when bond pads are arranged in a single row. Referring to FIG. 14, since the bond pad P6 is a reference bond pad, a search sequence (twice to the left and once to the right) is performed in a direction of an arrow according to the arrangement type of the bond pads.

When the bond pad detected in Operation S1201 or S1206 is the bond pad P4, assuming that the bond pad P4 is the reference bond pad, it is determined whether the bond pad P4 has the same arrangement type as that of bond pads P2 through P6.

In detail, when the search sequence (twice to the left and once to the right) is performed in the direction of the arrow starting from a center point of the bond pad P4, the bond pad P4 does not have the same arrangement type as that of bond pads P2 through P6, because no bond pad must be to the left of the reference bond pad P6. Thus, it is identified that the bond pad P4 is not the reference bond pad.

If the bond pad P4 is not the reference bond pad, the search sequence (twice to the left and once to the right) is performed for each of the bond pads adjacent to the bond pad P4 in the direction of the arrow until the reference bond pad is determined. Thus, the controller of the wire bonder recognizes the bond pad P6 as the reference bond pad.

The method of searching for the bond pads arranged in the single row can be used for a method of searching for bond pads arranged in a single column.

Figure 15:
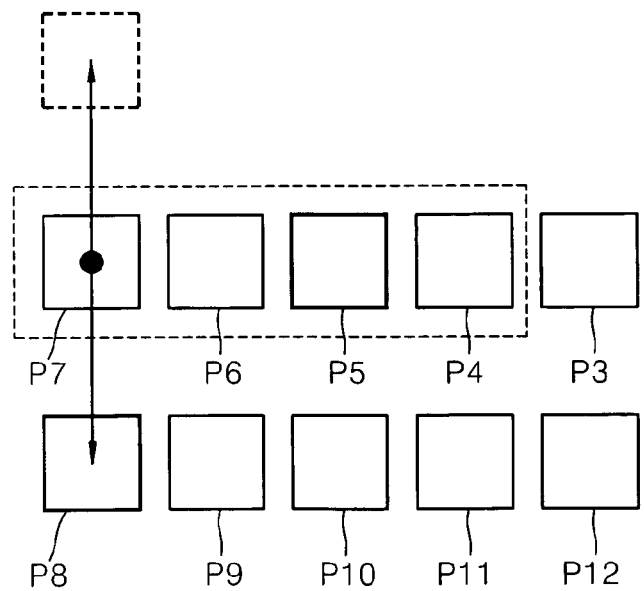
FIG. 15 is a diagram for explaining Operation S1203 or S1208 illustrated in FIG. 12 when bond pads are arranged in two rows.

FIG. 15 is a diagram for explaining Operation S1203 or S1208 (FIG. 12) when bond pads are arranged in two rows (see FIG. 7, for example). Referring to FIG. 15, since the bond pad P7 is a reference bond pad, a vertical search sequence (once upward and once downward) is added to the search sequence (twice to the left and once to the right) shown in FIG. 14. The bond pad P7 and the bond pad P8 are both determined to satisfy the requirement of the search sequence (twice to the left and once to the right) of FIG. 14. Furthermore, using the vertical search sequence, it is determined that a bond pad exists below the reference bond pad P7 and that no bond pad exists above the reference bond pad P7.

As can be appreciated, the method of searching for the bond pads arranged in the two rows can be adapted for a method of searching for bond pads arranged in two columns.

According to the method of correcting bonding coordinates, if a search for the locations of die recognition areas fails, bonding coordinates of a die are corrected according to a result obtained by searching for reference bond pads, thereby preventing the wire bonding from being frequently discontinued.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of correcting bonding coordinates according to a location of a die and a location of leads that are loaded for bonding in a wire bonder apparatus, the method comprising:
   locating die recognition areas on the die;
   if the locating step fails, detecting reference bond pads on the die;
   comparing locations of any reference bond pads from the detecting step with set locations;
   correcting bonding coordinates of a die and leads to be bonded according to a result of the comparing step;
   determining a number of reference bond pads closest to each of the die recognition areas; and
   determining an arrangement type of the plurality of bond pads.

2. The method of claim 1 further comprising the step of performing a teaching operation relative to a reference die and a plurality of reference leads.

3. The method of claim 2 wherein the step of performing a teaching operation comprises:
   identifying and storing a plurality of locations relative to reference coordinates of a plurality of bond pads on the reference die and a plurality of lead bonding points on the plurality of reference leads.

4. The method of claim 3 further comprising:
   storing center coordinates and image data of die recognition areas on the reference die.

5. The method of claim 1, further comprising:
   obtaining search tracks of a predefined shape originated from coordinates of each of the reference bond pads.

6. A method of correcting bonding coordinates according to a location of a die and a location of leads that are loaded for bonding in a wire bonder apparatus, the method comprising:
   locating die recognition areas on the die;
   if the locating step fails, detecting reference bond pads on the die;
   comparing locations of any reference bond pads from the detecting step with set locations;
   correcting bonding coordinates of a die and leads to be bonded according to a result of the comparing step;
   performing a teaching operation relative to a reference die and a plurality of reference leads that comprises identifying and storing a plurality of locations relative to reference coordinates of a plurality of bond pads on the reference die and a plurality of lead bonding points on the plurality of reference leads;
   storing center coordinates and image data of die recognition areas on the reference die;
   determining a number of reference bond pads closest to each of the die recognition areas; and
   determining an arrangement type of the plurality of bond pads.

7. The method of claim 6 further comprising:
   obtaining search tracks of a predefined shape originated from coordinates of each of the reference bond pads.

8. The method of claim 7, wherein the correcting step comprises:
   (a) searching for a first bond pad on the die;
   (b) searching for a second bond pad on the die;
   (c) comparing a center coordinate of the first bond pad with a center coordinate of the first reference bond pad;
   (d) comparing a center coordinate of the second bond pad with a center coordinate of the second reference bond pad; and
   (e) according to the comparing steps (c) and (d), correlating bonding coordinates of the plurality of bond pads on the die with the stored plurality of reference coordinates of a plurality of reference bond pads.

9. The method of claim 8 wherein step (a) further comprises:
   (a1) searching for the first bond pad on the die according to a first spiral search track originated from bonding coordinates of the first reference bond pad; and
   (a2) if the first bond pad is detected, searching from a center coordinate of the detected first bond pad for a first reference bond pad on the die according to an arrangement type of the plurality of bond pads on the die.

10. The method of claim 9, wherein operation (a2) comprises:
    (a21) determining an arrangement of bond pads proximate the detected first bond pad;

(a22) comparing the arrangement of bond pads proximate the detected first bond pad with the arrangement type; and (a23) setting the detected first bond pad to be the first reference bond pad, if the arrangement is the same as the arrangement type.

11. The method of claim 8 wherein step (b) further comprises:

(b1) searching for the second bond pad on the die according to a second spiral search track originated from bonding coordinates of the second reference bond pad; and (b2) if the second bond pad is detected, searching from a center coordinate of the detected second bond pad for a second reference bond pad on the die according to an arrangement type of the plurality of bond pads on the die.

12. The method of claim 11, wherein operation (b2) comprises:

(b21) determining an arrangement of bond pads proximate the detected second bond pad;

(b22) comparing the arrangement of bond pads proximate the detected second bond pad with the arrangement type; and (b23) setting the detected second bond pad to be the second reference bond pad, if the arrangement is the same as the arrangement type.

13. A method of correcting bonding coordinates for a wire bonder apparatus including a controller and a vision system, the method comprising:

loading in the wire bonder apparatus a first plurality of leads having a first plurality of bonding points, and a first die having a first plurality of bond pads;

identifying with the vision system a first plurality of coordinates corresponding with the first plurality of bonding points and the first plurality of bond pads;

storing in the controller the first plurality of coordinates;

defining at least one reference die recognition area relative to the first plurality of coordinates;

defining at least one reference lead recognition area relative to the first plurality of coordinates;

storing in the controller a center coordinate of the at least one reference die recognition area and a center coordinate of the at least one reference lead recognition area;

storing in the controller image data from the vision system relative to the at least one reference die recognition area and the at least one reference lead recognition area;

selecting at least one reference bond pad of the first plurality of bond pads, the at least one reference bond pad being closest to the at least one reference die recognition area;

determining an arrangement of the first plurality of bond pads;

the controller constructing a spiral search path originating from a center coordinate of the at least one reference bond pad;

removing from the wire bonder apparatus the first plurality of leads and the first die;

loading in the apparatus a second plurality of leads being similar to the first plurality of leads and having a second plurality of bonding points, and a second die being similar to the first die and having a second plurality of bond pads;

identifying an arrangement of leads in the second plurality of leads being substantially similar to the reference lead recognition area;

identifying an arrangement of bond pads in the second plurality of bond pads being substantially similar to the reference die recognition area;

searching, if the step of identifying an arrangement of bond pads fails, for at least one bond pad of the second plurality of bond pads that substantially corresponds with the at least one reference bond pad; and comparing a coordinate of the at least one bond pad with the center coordinate of the at least one reference bond pad;

relative to the comparing step, adjusting the first plurality of coordinates stored in the controller; and bonding the second plurality of bonding points with the second plurality of bond pads.

14. The method of claim 13 wherein the searching step comprises:

moving the vision system from the center coordinate of the at least one reference bond pad along the spiral search path;

detecting a bond pad along the spiral search path;

determining an arrangement of bond pads proximate the bond pad from the detecting step; and comparing the arrangement of the first plurality of bond pads with the arrangement of bond pads proximate the bond pad from detecting step.

* * * * *